Jan. 3, 1967 A. J. POLUCCI 3,296,561

DIGITAL ULTRASONIC DELAY LINE

Filed Aug. 15, 1962

INVENTOR.
ANTHONY J. POLUCCI

BY Clarence R. Patty, Jr.

ATTORNEY

United States Patent Office 3,296,561

Patented Jan. 3, 1967

3,296,561

DIGITAL ULTRASONIC DELAY LINE

Anthony J. Polucci, Bradford, Pa., assignor to Corning Glass Works, Corning, N.Y., a corporation of New York Filed Aug. 15, 1962, Ser. No. 217,015
4 Claims. (Cl. 333—30)

This invention relates to ultrasonic delay lines and more particularly to solid ultrasonic delay lines which, for example, may be employed to store energy impulses representing bits of information such as binary digits or the like.

Delay lines are used as dynamic storage devices in electronic circuits. One application for ultrasonic delay lines is in the radar receiver art, for example, in Moving Target Indication (MTI) devices. In such devices, the delay line is used to delay received echos or pulses for comparison with succeeding echos or pulses in order to determine whether any change has occurred in the timing of the signals. Another application is to provide for storage of energy impulses representing bits of information, such as binary digits or the like, in digital computors. By means of suitable electrical circuitry, such delay lines, herein termed digital delay lines, are fed said bits of information in a predetermined desired order, which bits are thereafter stored by recirculating them in said delay lines for any desired period of time, such as for example, until the particular bit or bits are required in the computing process are removed, are replaced, or the like. Said bits of information generally represent binary digits and are fed to the delay line as pulses of direct current energy or are represented by the lack of such pulses. This is contrasted to the input signal to ultrasonic delay lines, such as those used in MTI devices, where said input signal consists of continuous high frequency or pulsed radio frequency energy.

In forming ultrasonic digital delay lines to store binary digit bits of information or the like, it is desirable to have as little signal distortion as possible so that the delay line will have the highest possible data rate, that is the ability of the delay line to store the highest number of bits of information. Ideally, therefore, the output signal or pulse from the ultrasonic delay line would be identical with the input signal or pulse enabling minimum spacing between the various bits of information. As a practical matter, however, the signal becomes distorted due to dispersion, transducer ringing, mode conversion and the like, while being propagated through the delay medium, requiring the pulse spacing to be greater than the hereinabove noted ideal spacing, to avoid pulse overlapping. Digital delay lines having a signal to noise ratio of about 20 decibels or higher are generally acceptable.

As used herein, by distortion is meant the variation of the output signal as compared with the input signal. By dispersion, a form of distortion equivalent to phase distortion, is meant the variation of signal time delay with signal frequency.

It is also important that the delay line be formed of material having as low a signal attenuation as possible, preferably not over about $8\times10^{-3}$ decibels per cycle as measured at frequencies above one megacycle per second.

An object of this invention is to provide a digital ultrasonic delay line having a high data rate.

Another object of this invention is to provide a digital ultrasonic delay line having low distortion characteristics.

Still another object of this invention is to provide a nondispersive digital ultrasonic delay line.

A further object is to provide a digital ultrasonic delay line wherein a signal may be delayed without mode conversion.

A still further object is to provide a digital ultrasonic delay line wherein transducer ringing is suppressed.

According to the invention a digital ultrasonic delay line is provided which comprises a solid delay medium in the form of a flat plate of a desired peripheral configuration, said plate having input and output facets formed on the periphery thereof, the flat surfaces of said plate comprising the major planes of said delay medium, input and output transducers mounted on said input and output facets respectively, said transducers being mounted for vibration in the thickness-shear mode parallel to said major planes, an acoustic absorber adhered to each of said input and output transducers, each of said absorbers having a mechanical impedance substantially matching the mechanical impedance of each respective transducers, the width of said transducers and said absorbers being substantially equal to the thickness of said plate, the length of said transducers and said absorbers being substantially equal to each other. In addition the major planes and the facets of said delay medium may be highly polished and the reflection facets of the delay medium are formed so that the signal strike angles are greater than the critical angle of the delay medium.

Additional objects, features, and advantages of the present invention will become apparent to those skilled in the art, from the following detailed description and attached drawing on which, by way of example, only the preferred embodiment of this invention is illustrated.

Figure 1:
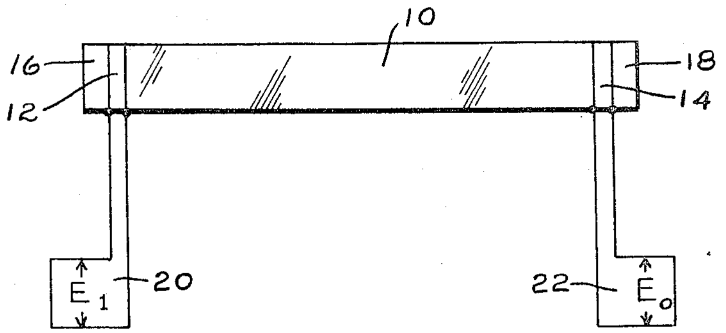
FIG. 1 is a schematic illustration of a digital ultrasonic delay line assembly.

A simple delay line assembly, as schematically illustrated in FIG. 1, includes a digital ultrasonic delay or transmission medium 10, transducer members 12 and 14, acoustic absorbers 16 and 18 and electrical signal input and output circuits 20 and 22.

Figure 2:
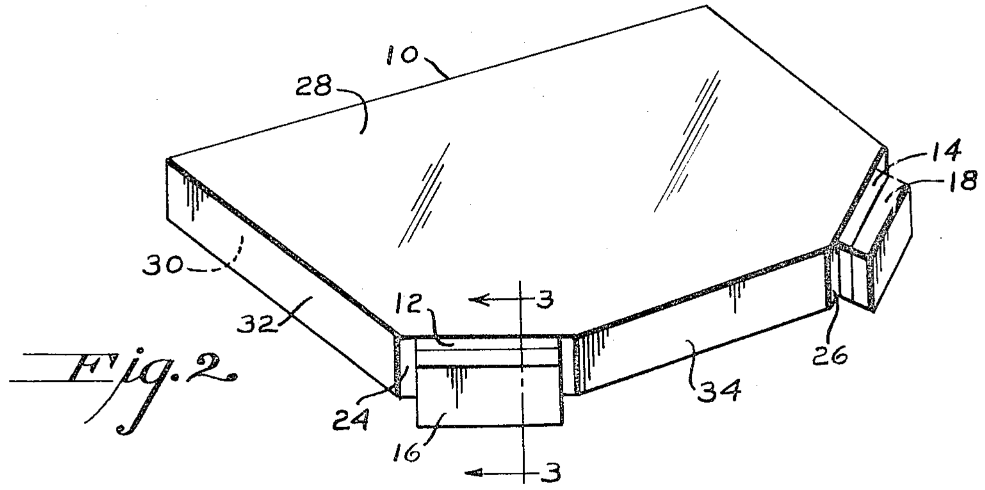
FIG. 2 is an oblique view of a digital ultrasonic delay line.

FIG. 2 illustrates digital ultrasonic delay medium 10 with transducer 12 and acoustic absorber 16 mounted on facet 24, and transducer 14 and acoustic absorber 18 mounted on facet 26.

Suitable delay medium materials are fused silica, alkali-lead-silicate glass such as described in copending patent application by H. L. Hoover and M. E. Nordberg, Serial No. 118,185, filed June 19, 1961, and the like.

Although the peripheral configuration of a digital ultrasonic delay line medium in accordance with this invention is not critical, except as hereinafter noted in connection with the forming of signal reflection facets, and any conventional or desired configuration may be used, the medium must be of a flat plate type. The blank for such a delay medium may be either molded in a desired shape or cut from a large shaped blank in accordance with conventional delay medium forming procedures, and may then be annealed in accordance with conventional delay medium annealing practices. The blank is then ground and polished as hereinafter described.

Transducers 12 and 14 are composed of a crystalline piezoelectric material, such as crystalline quartz, barium titanate, mixtures of lead zirconate and lead titanate, potassium sodium niobate and the like. They are sealed to facets 24 and 26 respectively on delay medium 10. Acoustic absorbers 16 and 18 may be composed of any acoustic absorbing material such as lead, tin, and the like, and the composition is not critical as long as the material can be bonded to the transducer material, has a mechanical impedance as closely matched to that of the transducer as possible, and has a high signal attenuation. A particularly suitable absorber material for use with barium titanate or crystalline-quartz transducers is an indium rich alloy comprising about 60% indium and about 40% tin. Matching the mechanical impedance of the transducer suppresses transducer ringing and provides delay line transducers having low-distortion operation.

Generally, acoustic absorbers and transducers are formed as flat plates. It has been found that in forming the acoustic absorbers and transducers of substantially the same length and width, and further forming the widths, illustrated by dimension X in FIG. 3, to substantially correspond to the thickness of the delay medium plate to which they are affixed, further reduces signal distortion by contributing to a non-dispersive mode of propagation within the delay medium when the transducers are mounted for the SH thickness-shear mode of vibration causing the vibrations to be parallel to the major planes of the delay medium.

When operating the transducers in the SH thickness-shear mode, where the vibrations are parallel to the major planes of a plate type delay medium, the signal reflection facets must be so formed that the signal strike angles are not less than the critical angle of the delay medium. If the strike angles are less than the critical angle, the signal transverse waves are at least in part converted to longitudinal or compressional waves and such mode conversion causes signal losses and dispersion, thus subsequent distortion. It has also been discovered that when the strike angles are substantially 45° the reflected signal phase change is substantially zero. Since the critical angle of such suitable delay medium materials as fused silica and alkali-lead-silicate glass is about 39°, the signal mode conversion and phase change may be maintained at a minimum by forming the reflecting facets so that the signal strike angles are substantially 45°.

Figure 3:
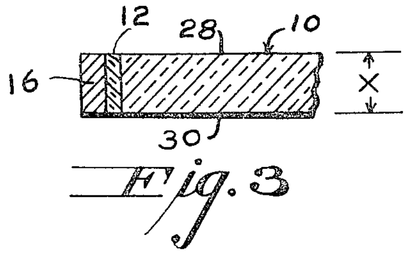
FIG. 3 is a view along 3—3 of FIG. 2.

It has also been found that by polishing the major planes of a plate type delay medium such as plane surfaces 28 and 30 and the reflecting facets such as 32 and 34, as well as the transducer mounting facets such as 24 and 26, as shown in FIGS. 2 and 3, to substantially a plate glass finish, the resulting delay medium will provide a substantially further reduced distortion operation.

A typical example of carrying out this invention is illustrated in FIGS. 2 and 3 of the drawing and the following description. A delay medium consisting of fused silica may be suitably formed into a rectangular plate type configuration. Signal input and output facets are formed at adjacent corners of said plate and are so positioned that the signal strike angles at the reflection facets would not be less than the critical angle of fused silica. The plate is then polished to substantially a commercial plate glass polish on the major plane surfaces, reflection facets, and input and output facets with cerium oxide having ½ to 1 micron size.

Input and output transducers of crystalline quartz, AC cut, having a mechanical impedance of about $8.93\times10^6$ kg./m.$^2$ sec., MKS rationalized, are formed having a width substantially equal to the thickness of said delay medium. The transducers are then adhered, by any one of various methods well known in the art, to the input and output facets on the delay medium with the width of said transducers being coincident with the thickness of the delay medium. The transducers are mounted on said facets for thickness-shear mode vibration parallel to the major planes of said delay medium.

Acoustic absorbers are formed of the heretofore noted indium rich alloy having a mechanical impedance of about $7.2\times10^6$ kg./m.$^2$ sec., MKS rationalized. The absorbers are formed having substantially the same width and length as the said transducers and are mounted thereon substantially coincident therewith.

A digital ultrasonic delay line produced in accordance with this invention will have significantly lower distortion characteristics than heretofore known ultrasonic delay lines, permit a predominately non-dispersive mode of signal propagation through the delay medium, provide said propagation substantially without mode conversion, and will have a higher data rate than heretofore possible.

Although the present invention has been described with respect to specific details of certain embodiments thereof, it is not intended that such details be limitations upon the scope of the invention except insofar as set forth in the following claims.

What is claimed is:

1. In combination, a flat plate-type solid delay medium having signal input, output and reflection facets arranged about the periphery thereof and so disposed that the signal strike angles are at least equal to the critical angle of the delay medium, the flat surfaces of said plate comprising the major planes of said delay medium, the input, output and reflection facets and the major planes being polished surfaces, signal input and output transducers mounted on said input and output facets respectively for vibration in the thickness-shear mode parallel to said major planes, said transducers extending substantially from one of the major planes to the other, an acoustic absorber adhered to and substantially coincident with said input transducer and an acoustic absorber adhered to and substantially coincident with said output transducer, each of said acoustic absorbers having a mechanical impedance substantially matching the mechanical impedance of each respective transducer.

2. In the combination of claim 1 a solid delay medium formed of material selected from the group consisting of fused silica and alkali-lead-silicate glass.

3. In the combination of claim 1 input and output transducers formed of material selected from the group consisting of crystalline quartz, barium titanate, potassium sodium niobate, and mixtures of lead zironate and lead titanate.

4. In the combination of claim 2 a solid delay medium having signal input, output and reflection facets so disposed that the signal strike angles are substantially 45°.

References Cited by the Examiner

UNITED STATES PATENTS

| | | | |
|---|---|---|---|
| 2,624,804 | 1/1953 | Arenberg | 333—30 |
| 2,672,590 | 3/1956 | McSkimin | 333—72 |
| 2,839,731 | 6/1958 | McSkimin | 333—30 |
| 2,859,415 | 11/1958 | Fagen | 333—30 |
| 2,867,777 | 1/1959 | Robinson | 333—30 |
| 2,957,142 | 10/1960 | May | 333—30 |
| 2,965,851 | 12/1960 | May | 333—30 |

HERMAN KARL SAALBACH, *Primary Examiner.*

C. BARAFF, *Assistant Examiner.*